(12) United States Patent
Liu

(10) Patent No.: US 8,077,230 B2
(45) Date of Patent: Dec. 13, 2011

(54) METHODS AND APPARATUS FOR REDUCING COLOR MATERIAL RELATED DEFECTS IN IMAGERS

(75) Inventor: Saijin Liu, Boise, ID (US)

(73) Assignee: Aptina Imaging Corporation, George Town (KY)

(*) Notice: Subject to any disclaimer, the term of this patent is extended or adjusted under 35 U.S.C. 154(b) by 846 days.

(21) Appl. No.: 12/213,333

(22) Filed: Jun. 18, 2008

(65) Prior Publication Data
US 2009/0316028 A1 Dec. 24, 2009

(51) Int. Cl.
*H04N 5/335* (2011.01)
(52) U.S. Cl. ............ 348/272; 359/885; 438/71
(58) Field of Classification Search .......... 348/272, 348/280, 294–324; 359/885–892; 438/69, 438/71
See application file for complete search history.

(56) References Cited

U.S. PATENT DOCUMENTS

| | | | |
|---|---|---|---|
| 5,914,206 A | 6/1999 | Takasaki et al. | |
| 6,297,071 B1 | 10/2001 | Wake | |
| 6,582,988 B1 | 6/2003 | Hsiao et al. | |
| 6,746,939 B2 | 6/2004 | Shimozono et al. | |
| 6,956,253 B2 | 10/2005 | Weng et al. | |
| 7,005,718 B2 | 2/2006 | Wester | |
| 7,297,916 B1 | 11/2007 | Feng | |
| 7,326,503 B2 | 2/2008 | Hodge et al. | |
| 7,341,885 B2 | 3/2008 | Kim | |
| 2006/0098316 A1* | 5/2006 | Tatsuzawa et al. | 359/891 |
| 2008/0070342 A1 | 3/2008 | Oh et al. | |
| 2008/0286896 A1* | 11/2008 | Jung | 438/70 |

* cited by examiner

*Primary Examiner* — Darryl J Collins

(57) ABSTRACT

A film is used on the surface of a color filter array to keep tiny particles that remain on the surface so that they do not interfere during subsequent processing steps. The particles may be the result of forming the color filter array or other structures. The film can prevent the formation of particle clusters in an imager.

33 Claims, 8 Drawing Sheets

| G | R | G | R | G | R |
|---|---|---|---|---|---|
| B | G | B | G | B | G |
| G | R | G | R | G | R |
| B | G | B | G | B | G |
| G | R | G | R | G | R |

METHODS AND APPARATUS FOR REDUCING COLOR MATERIAL RELATED DEFECTS IN IMAGERS

FIELD OF THE INVENTION

Disclosed embodiments relate generally to imagers, and more particularly to a method and apparatus for obtaining imagers with reduced residue related defects.

BACKGROUND OF THE INVENTION

There are a number of different types of semiconductor-based imagers including charge coupled devices (CCD's), photodiode arrays, charge injection devices (CID's), hybrid focal plane arrays, and complementary metal oxide semiconductor (CMOS) imagers. Current applications of solid-state imagers include cameras, scanners, machine vision systems, vehicle navigation systems, video telephones, computer input devices, surveillance systems, automatic focus systems, star trackers, motion detector systems, image stabilization systems, and other image acquisition and processing systems.

Solid state imagers include an array of pixels that converts light energy received, through an optical lens, into electrical signals. Each pixel contains a photosensor for converting a respective portion of a received image into an electrical signal. The electrical signals produced by the array of photosensors are processed to render a digital image.

Imagers are sensitive to light in the visible spectrum. Naturally, however, the imagers used in digital imaging are essentially capturing black and white (light and dark) images. To capture color images, the spectral components of incident light must be separated and collected. Thus, to allow the photosensors to capture a color image, they must be able to separately detect photons traveling at different wavelengths. Accordingly, each pixel should be sensitive only to one color or spectral band. For this, a color filter array (CFA) is typically placed in front of the pixel array so that each pixel measures the light of the color of its associated filter. Color filters are typically pigmented or dyed material that will only allow a narrow band of visible light, e.g., red, blue, or green, to pass through. For most low cost CMOS or CCD imagers, the color filters are integrated with the pixel circuitry in a patterned array. A common example of a color filter pattern is the tiled color filter array illustrated in U.S. Pat. No. 3,971,065, and commonly referred to as "the Bayer pattern" color filter array, although other types of color filter array patterns exist. The use of a color filter array allows what would otherwise be black and white imagers to produce color images.

As shown in FIG. 1, the Bayer pattern 15 comprises an array of repeating red (R), green (G), and blue (B) filters. Half of the filters in the Bayer pattern 15 are green, while one quarter are red and the other quarter are blue. As shown, the Bayer pattern 15 repeats a row of alternating red and green color filters followed by a row of alternating blue and green filters.

The Bayer patterned color filter array (or filter array having another pattern) may be deposited/placed on top of an array 20 of pixels 22, as shown in cross section in FIG. 2. Specifically, an array 20 of pixels 22 is formed in a semiconductor substrate 10. Each of the pixels 22 has a photosensitive element 12, which may be any photon-to-charge converting device, such as a photogate, photoconductor or photodiode. The color filter array 15 may be formed over one or more metal layers 18 in the array 20, separated from the photosensor 12 by several insulating layers like an interlevel dielectric layer (ILD) 14 and a passivation layer 16. The metal layers 18 may be opaque and used to shield the area of the pixels that is not supposed to be light sensitive. Micro-lenses 21 are formed over the color filter array 15. In operation, incident light is focused by the micro-lenses 21 through the Bayer patterned color filter array 15 to the photosensitive elements 12.

One technique for fabricating color filter arrays uses evaporated colorants. To fabricate such color filter arrays over imagers, a photoresist containing a colorant, generally a pigment, is deposited on a semiconductor substrate. The pigmented photoresist is patterned, leaving resist with color pigment over the pixels in patterned areas. However, color pigment residue is left behind in the non-patterned areas after one set of color filter elements is patterned, which can interfere with formation of subsequent color filter array elements or degrade the overall imager performance. This color pigment residue is undesirable. One way in which this color pigment residue may be removed is with a descumming process, such as that disclosed U.S. Pat. No. 7,326,503, assigned to Micron Technology, Inc.

However, as shown in FIG. 3A, after a descumming process, there are many tiny particles containing pigment 25 which may remain on the surface of the color filter array 15. These tiny particles containing pigment 25 may affect the transmission performance of a micro-lens formed over the color filter array 15. Additionally, referring to FIG. 3B, these tiny particles containing pigment 25 are loose and if the next layer 35 is formed using a spin-on process, for example, the tiny particles containing pigment 25 can move and may combine with each other to form bigger clusters 30. This may result in defects or striation patterns that could cause the imager to fail.

Imagers also include light block structures surrounding the imaging pixels of the pixel array in order to cover the periphery circuits of an imager and/or so-called dark reference pixels which are not used for imaging. Additionally, these light block structures need to be absorptive so that no light flares that may affect the camera lens are present. One known method of forming these light block structures uses a black resist, such as, e.g., JSR black resist JSR BLACK812 or FFEM black resist SK5000L. One problem with using such black resists is the residue level which remains after formation. As shown in FIG. 6A, after light blocks 115 are formed, pigment residue 120 remains. Prior to FIG. 6A, the light blocks were patterned on the periphery area of the imager and/or pixel array as is known in the art. A plasma clean (or other acceptable process) is used to eliminate the pigment residues in the active array. However, tiny loose particles 145 can remain on the surface of the light blocks 115, as can be seen in FIG. 6B. These particles 145 may also form part of residue 25 over the color filter array 15 shown in FIG. 3A.

Accordingly, an improved method to reduce residue related defects of a color filter array or other structure formed of a color resist is desired.

BRIEF DESCRIPTION OF THE DRAWINGS

FIG. 1 is an illustration of a conventional Bayer color filter array.

DETAILED DESCRIPTION OF THE INVENTION

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, only some of which are discussed in detail below.

The term "pixel," as used herein, refers to a photo-element unit cell containing a photosensor device and associated structures for converting photons to an electrical signal. For purposes of illustration, a representative three-color R, G, B pixel array is described herein; however, the invention is not limited to the use of an R, G, B array, and can be used with other color arrays, such as a C, M, Y, G (which represents cyan, magenta, yellow and green color filters) array, a single color filter array, or for pixel arrays for filtering and detecting non-visible spectra photo emissions. Accordingly, the following detailed description is not to be taken in a limiting sense.

In the following description, the embodiments are described in relation to the formation of a color filter array for use with an imager for convenience purposes only; the disclosed embodiments, however, have wider applicability to any application using a patterned color photoresist with subsequent spin-on processes. Disclosed embodiments provide a method of reducing the concern for the redistribution of tiny particles containing pigment that remain on a surface of a color filter array after descumming and thereby reducing defects caused by this redistribution of the tiny particles containing pigment.

Figure 2:
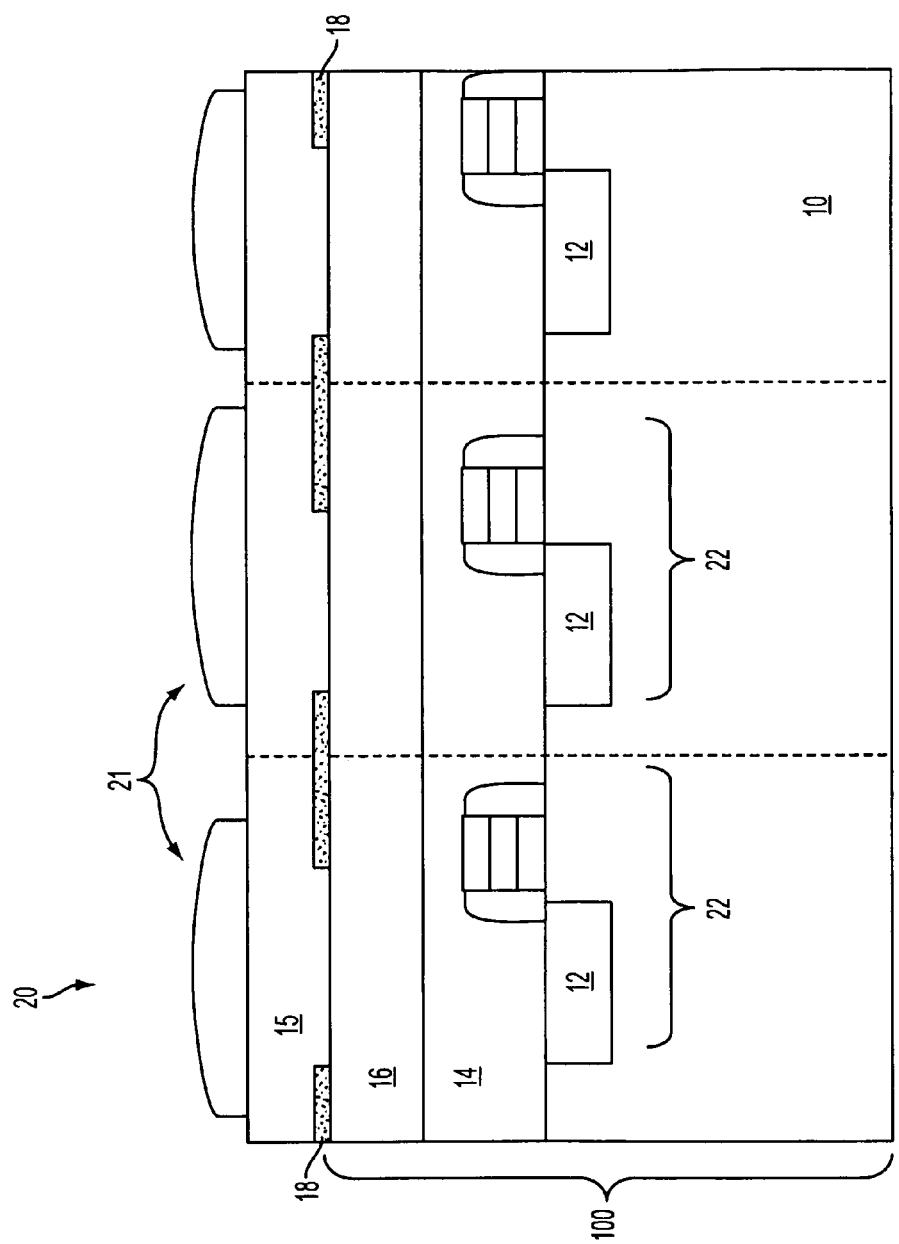
FIG. 2 is a cross-sectional view of a portion of a pixel array having a color filter array.
Figure 3A:
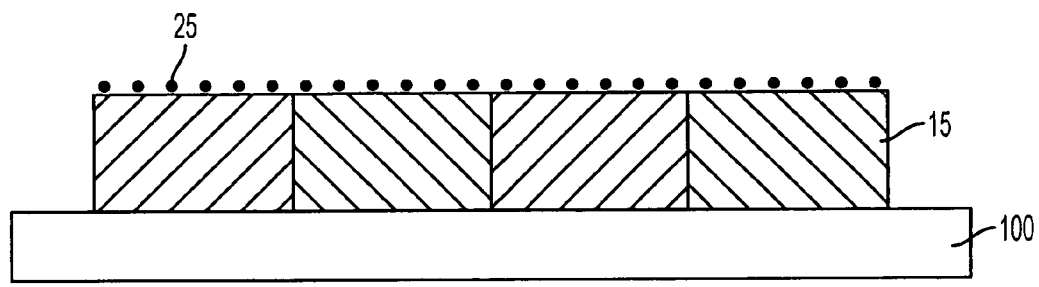
FIG. 3A illustrates a color filter array having loose tiny particles containing pigment present on a top surface during processing.

Known processing steps are performed in order to arrive at the conventional color filter array 15 illustrated in FIG. 3A. The novel embodiments disclosed herein start with the FIG. 3A structure. It should be understood that the substrate 100 may be another layer in an imager, such as a passivation layer 16 (FIG. 2).

Figure 3B:
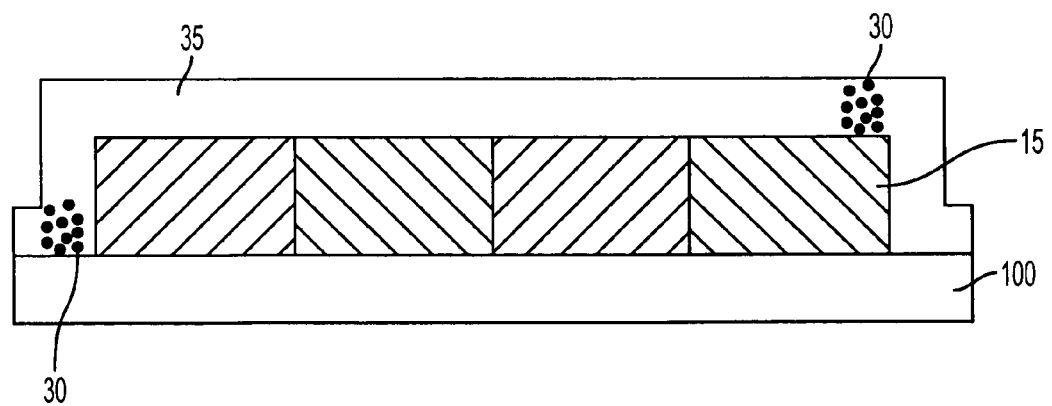
FIG. 3B illustrates a cluster defect caused by redistribution of the tiny particles containing pigment of FIG. 3A.
Figure 4A:
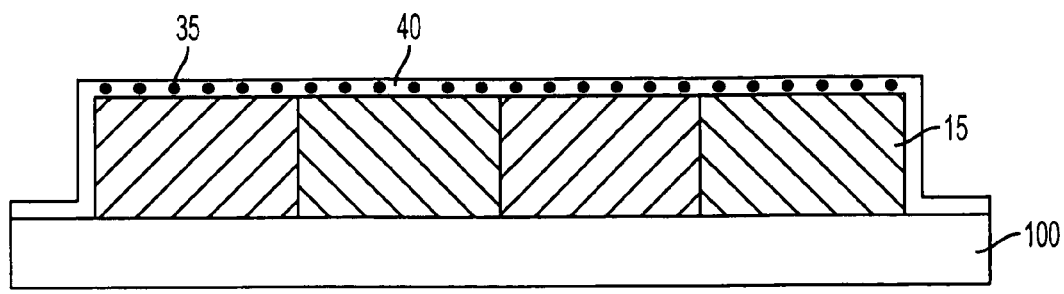
FIG. 4A illustrates an example color filter array including a thin film to fasten tiny particles containing pigment, in accordance with disclosed embodiments.
Figure 4B:
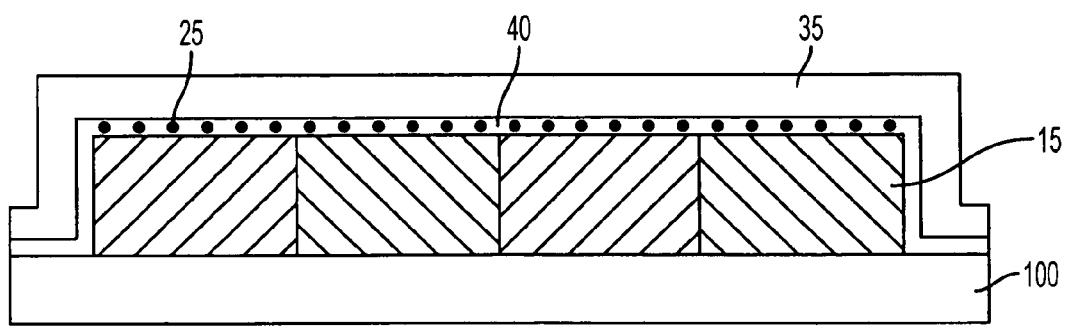
FIG. 4B illustrates the color filter array of FIG. 4A at a subsequent processing step.

In one disclosed embodiment, as shown in FIG. 4A, after the descumming process (FIG. 3A), a thin film 40 (described below) is provided over the surface of the color filter array 15. The thin film 40 fastens the tiny particles containing pigment 25 to the surface so that they cannot be moved during subsequent processing steps and form clusters/defects 30 seen in FIG. 3B. In other words, the thin film 40 traps the tiny particles containing pigment 25. As shown in FIG. 4B, the subsequent layer 35 is formed without any movement of the tiny particles containing pigment 25.

The deposition process used to form thin film 40 may be any low temperature process (below 260° C.) that is able to deposit a very thin film, such as, for example, molecular vapor deposition (MVD), atomic layer deposition (ALD) or chemical vapor deposition (CVD). The thin film may be formed of any transparent material, such as, for example, $SiO_2$, $TiO_2$, $Si_3N_4$, $Al_2O_3$, and $HfO_2$. The thickness of the film may as thin as several nanometers or as thick as tens of nanometers. In this embodiment, the film has a thickness of, for example, about 2 nm to about 20 nm.

Figure 5A:
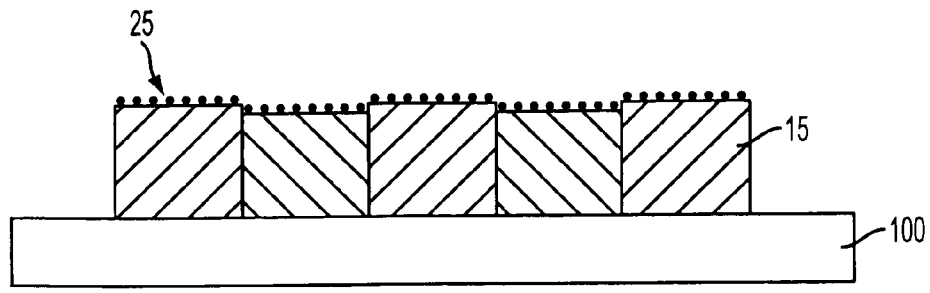
FIG. 5A illustrates an example color filter array after a descumming process, having loose tiny particles containing pigment present on a top surface.
Figure 5B:
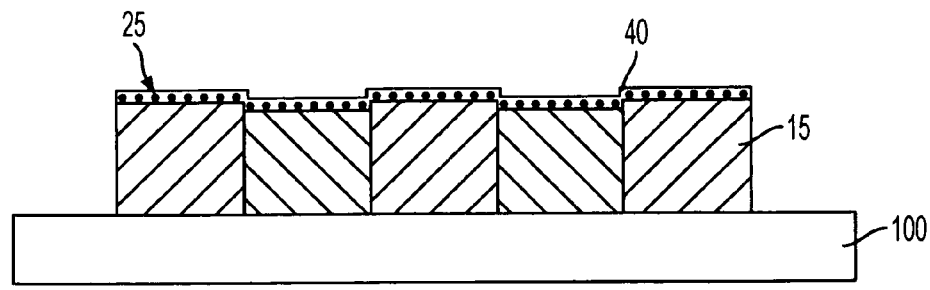
FIG. 5B illustrates the color filter array of FIG. 5A including a thin film to fasten tiny particles containing pigment, in accordance with disclosed embodiments.

In another disclosed embodiment, the use of the thin film 40 allows for a reduced stack height. Any known method may be used to form color filter array 15, which may have some topography variation, as seen in FIG. 5A. As previously noted, known methods for color filter array formation use a mild plasma clean step (descumming), which may leave loose tiny particles containing pigment 25 on the surface of the color filter array 15. As shown in FIG. 5B, in accordance with the disclosed embodiment, a thin film 40 is deposited over the color filter array 15 to fasten the tiny particles containing pigment 25 in place during subsequent processing steps. An additional advantage of this embodiment is that the deposited thin film 40 may act as an etch-stop layer during subsequent processing, as will be described in more detail below.

The deposited thin film 40 may be formed generally of any transparent material that has good etching selectivity from a planar layer material 45 (see FIG. 5C) formed over thin film 40. Possible materials for the thin film 40 include $SiO_2$, $TiO_2$, $Si_3N_4$, $Al_2O_3$, and $HfO_2$. A preferred material is $SiO_2$. The deposited thin film 40 can be formed as a very thin layer having a thickness of, for example, about 2 nm to about 20 nm. As previously discussed, the thin film 40 may be deposited using any known method that can deposit the appropriate materials at a low temperature (below 260° C.) and with good conformity and accurate thickness control. Possible deposition methods include molecular vapor deposition (MVD), atomic layer deposition (ALD) or chemical vapor deposition (CVD). Molecular vapor deposition is favorable due to its ability to provide ultra thin film deposition with angstrom level accuracy and complete conformity at almost room temperature and at a low cost.

Figure 5C:
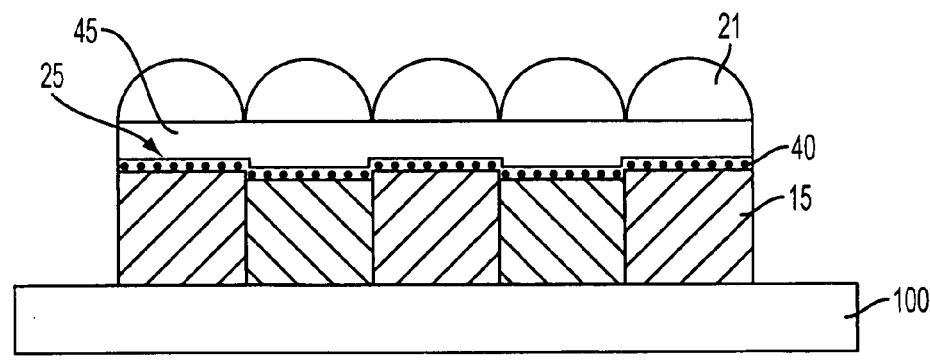
FIG. 5C illustrates the color filter array of FIG. 5B at a subsequent processing step.

Once the thin film 40 has been deposited, thereby fastening the tiny particles containing pigment 25 on the surface of the color filter array 15, conventional methods may be used to form the planar layer 45 and micro-lenses 21, as shown in FIG. 5C. The planar layer 45 may also be formed as an intentionally thicker planar layer (e.g., the thickness of the micro-lens height). One embodiment uses similar materials for both the planar layer 45 and the micro-lenses 21. However, this is not required and different materials may be used for the planar layer 45 and the micro-lens 21 as long as the materials are appropriate for forming the micro-lenses 21. Suitable materials for forming the micro-lenses 21 include any transparent lens material, such as, for example, silicon oxides SiOx, silicon carbide SiC, silicon nitride $S_3N_4$, titanium dioxide $TiO_2$, indium tin oxide ITO, aluminum oxide $Al_2O_3$, and other transparent lens materials.

Another benefit of the disclosed embodiments is that the material forming thin layer 40 may be selected having optical properties that allow the optical properties of the color filter array 15 to be slightly adjusted, such as for example, focus depth, wavelength, etc.

Figure 5D:
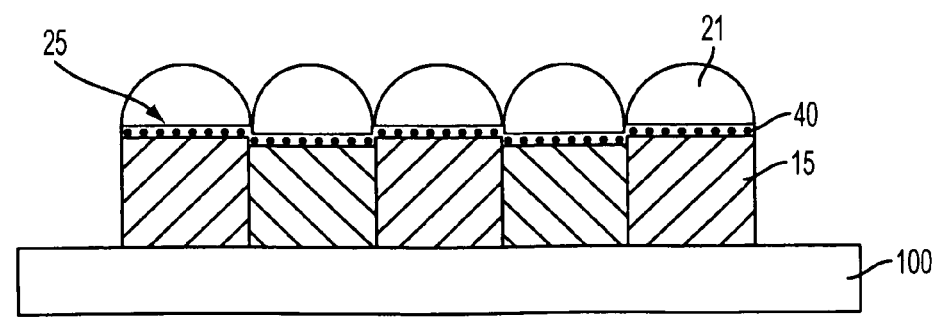
FIG. 5D illustrates the color filter array of FIG. 5C at a subsequent processing step.

The micro-lens pattern is etched into the planar layer 45, as shown in FIG. 5D. The etching process can be either a timed etching process or an etching process whereby the deposited thin film 40 acts as an etch stop layer, thereby protecting the color filter array 15 from the etching process.

Figure 6A:
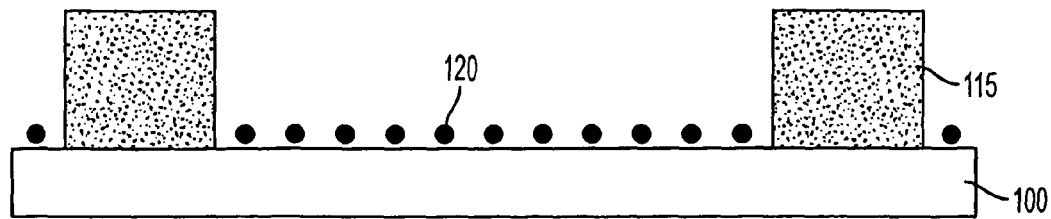
FIG. 6A illustrates an example imager having a light block structure formed at its periphery.
Figure 6B:
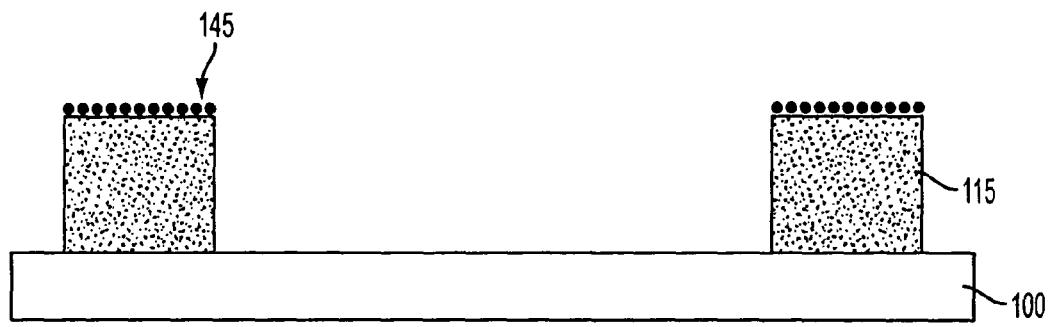
FIG. 6B illustrates the imager of FIG. 6A at a subsequent processing step.
Figure 6C:
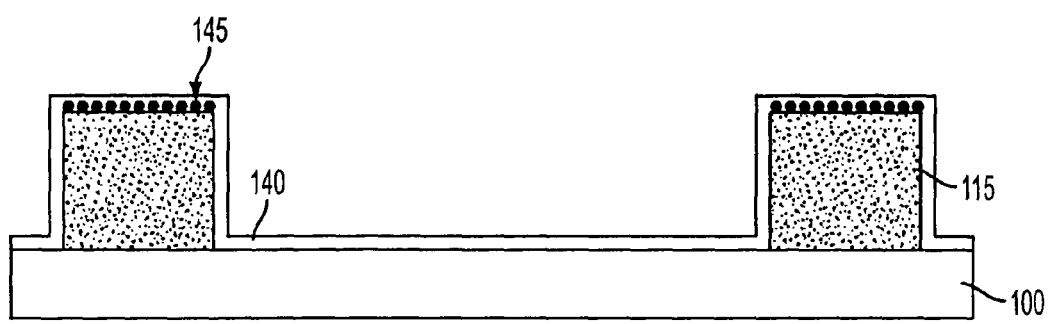
FIG. 6C illustrates the imager of FIG. 6B at a subsequent processing step.
Figure 6D:
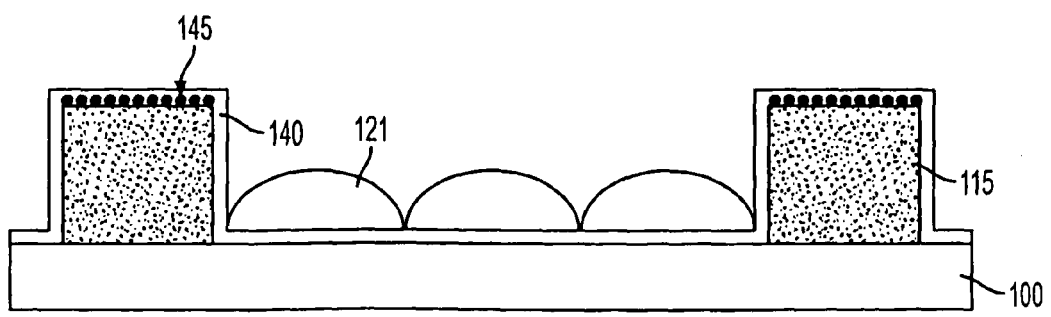
FIG. 6D illustrates the imager of FIG. 6C at a subsequent processing step.

Disclosed embodiments also have applicability in forming light block structures for protecting periphery circuits in an imager. As previously discussed, light block structures are required to protect the periphery circuits and/or dark reference pixels of an imager so that peripheral circuits and/or dark reference pixels are not affected or influenced by incoming light. In accordance with the disclosed embodiments, after the light blocks 115 (FIG. 6B) are formed surrounding the imaging pixels of the pixel array, pigment residue 120 remains on a surface of the imager. As shown in FIG. 6C, a thin film 140 is deposited over the entire surface of the imager, in order to fasten the tiny loose particles 145 and prevent them from migrating during subsequent processes. As previously discussed, the thin film 140 may be deposited, for example, by molecular vapor deposition (MVD), atomic layer deposition (ALD) or chemical vapor deposition (CVD). Molecular vapor deposition (MVD) is a preferred method because it is able to deposit a very thin film with great conformity. Also as previously discussed, the thin film may be formed of any transparent material. $SiO_2$ is preferred because it has good adhesion to micro-lens materials. FIG. 6D illustrates a subsequent spin-on process, for example, micro-lens 121 formation. Note that during these subsequent processes, the particles containing pigment 145 remain trapped in the thin film 140 and are not able to form cluster defects or striations on the imager.

Figure 7:
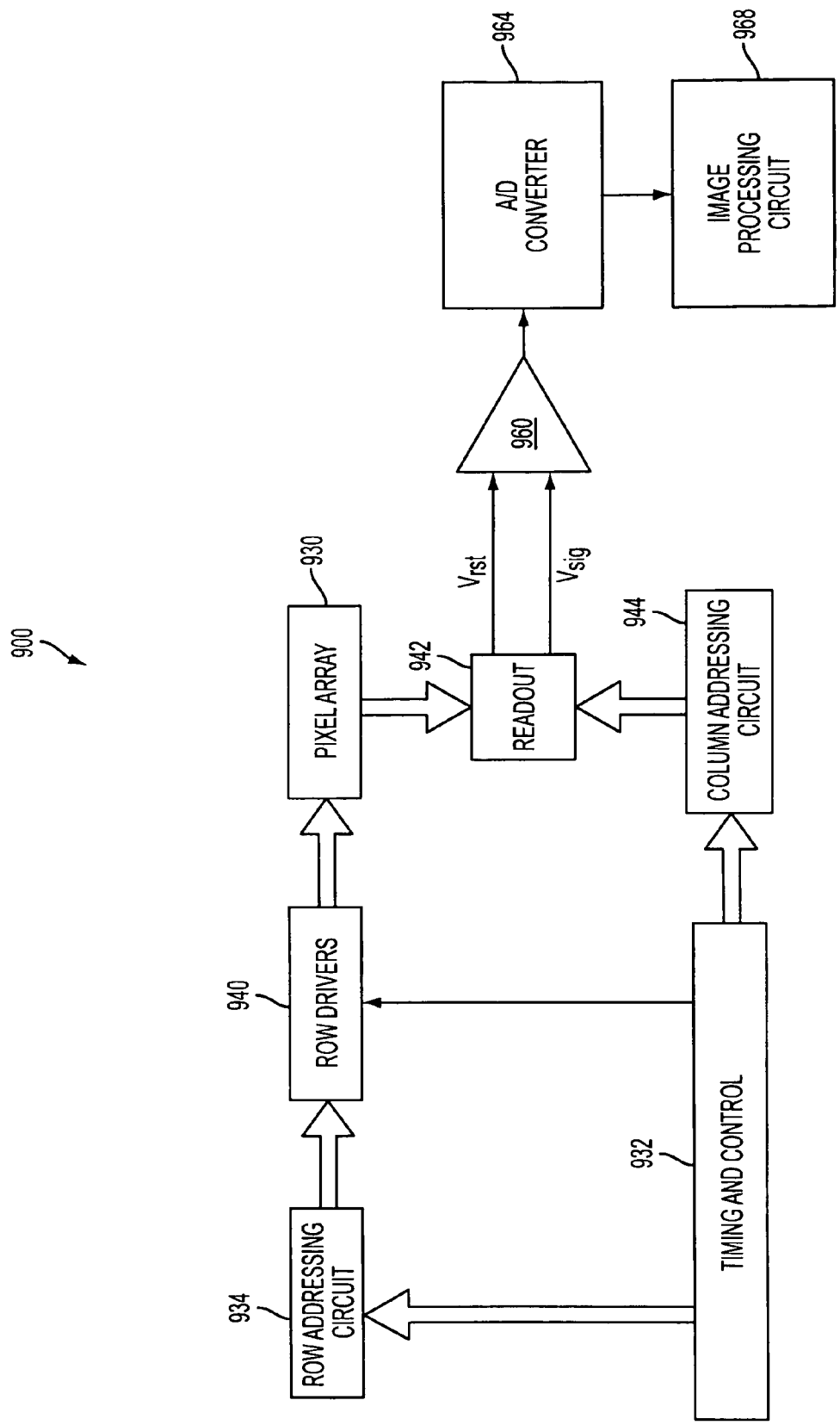
FIG. 7 is a block diagram of an imager manufactured in accordance with disclosed embodiments.

FIG. 7 illustrates a block diagram of a imager 900 that implements disclosed embodiments and which uses CMOS technology; however, the embodiments disclosed herein may be used with other pixel arrays, e.g., CCD and others. Imager 900 includes a color filter array formed over the pixels of a pixel array 930 and/or a light block structures formed in accordance with disclosed embodiments. A timing and control circuit 932 provides timing and control signals for enabling the reading out of signals from pixels of the pixel array 930 in a manner commonly known to those skilled in the art. The pixel array 930 has dimensions of M rows by N columns of pixels, with the size of the pixel array 930 depending on a particular application.

Signals from the imager 900 are typically read out a row at a time. The timing and control circuit 932 selects a particular row of pixels in the pixel array 930 by controlling the operation of a row addressing circuit 934 and row drivers 940. Signals stored in the selected row of pixels are provided to a readout circuit 942. The signals read from each of the columns of the array sequentially or in parallel using a column addressing circuit 944. The pixel signals corresponding to the pixel reset signal Vrst and image pixel signal Vsig are provided as outputs of the readout circuit 942, and are typically subtracted in a differential amplifier 960 and the result digitized by an analog to digital converter 964 to provide a digital pixel signal. The digital pixel signals represent an image captured by pixel array 930 and are processed in an image processing circuit 968 to provide an output image.

Figure 8:
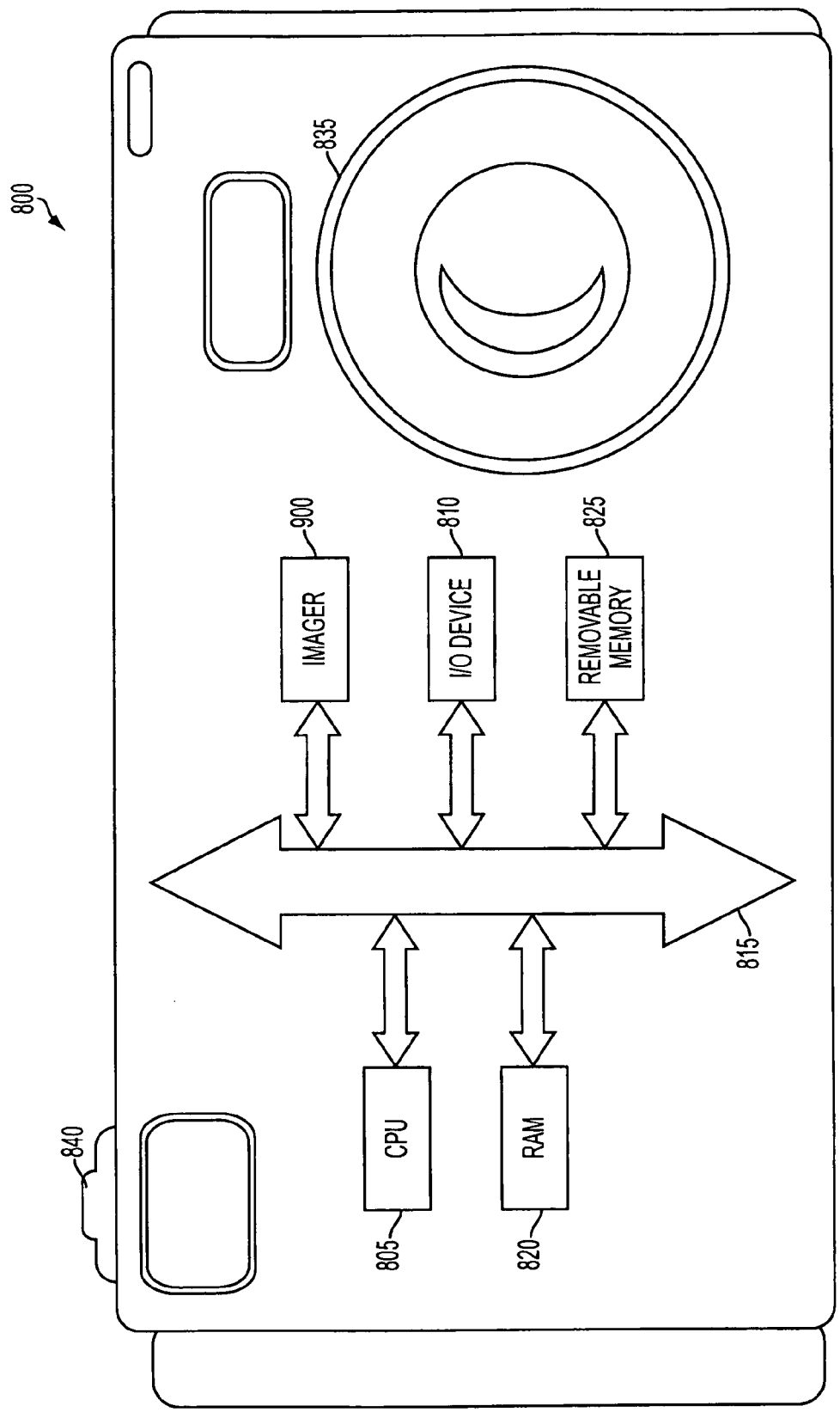
FIG. 8 shows a processor system that includes the imager of FIG. 7.

FIG. 8 illustrates a processor system as part of a digital still or video camera system 800 employing an imager 900 as illustrated in FIG. 7. Imager 900 includes a color filter array and/or light block structures in accordance with disclosed embodiments. The processing system includes a processor 805 (shown as a CPU) which implements system, e.g. camera 800, functions and also controls image flow and image processing. The processor 805 is coupled with other elements of the system, including random access memory 820, removable memory 825 such as a flash or disc memory, one or more input/output devices 810 for entering data or displaying data and/or images and imager 900 through bus 815 which may be one or more busses or bridges linking the processor system components. A lens 835 allows an image or images of an object being viewed to pass to the pixel array 930 of imager 900 when a "shutter release"/"record" button 840 is depressed.

The camera system 800 is only one example of a processing system having digital circuits that could include imagers. Without being limiting, such a system could also include a computer system, cellular telephone system, scanner, machine vision system, vehicle navigation system, video telephone, surveillance system, automatic focus system, star tracker system, motion detection system, image stabilization system, and other image processing systems.

While disclosed embodiments have been described in detail, it should be readily understood that the claimed invention is not limited to the disclosed embodiments. Rather the disclosed embodiments can be modified to incorporate any number of variations, alterations, substitutions or equivalent arrangements not heretofore described.

The invention claimed is:

1. An imager comprising:
   an array of pixels comprising photosensors;
   a color filter array formed over the pixels, the color filter array having a surface and residual particles located on the surface; and
   a film formed over the color filter array to keep in place the residual particles residing on the surface of the color filter array.

2. The imager of claim 1, wherein the residual particles are colored particles resulting from formation of the color filter array.

3. The imager of claim 1, wherein film has a thickness of from about 2 nm to about 20 nm.

4. The imager of claim 1, wherein the film comprises one of $SiO_2$, $TiO_2$, $Si_3N_4$, $Al_2O_3$, and $HfO_2$.

5. The imager of claim 1, wherein the film comprises $SiO_2$.

6. The imager of claim 1, further comprising a plurality of micro-lenses formed over the film.

7. The imager of claim 1, further comprising a light block structure surrounding imaging pixels of the pixel array and comprising a black resist material, wherein the residual particles at least partially comprise residue of the black resist material.

8. The imager of claim 7, wherein the film is formed over the light block structure.

9. A method of forming an imager, comprising:
   forming a plurality of pixels;
   forming a color filter array over the plurality of pixels; and
   forming a film over the color filter array, wherein the film traps particles that are on a surface of the color filter array.

10. The method of claim 9, wherein the particles on the surface of the color filter array contain pigment.

11. The method of claim 9, wherein the film comprises one of $SiO_2$, $TiO_2$, $Si_3N_4$, $Al_2O_3$, and $HfO_2$.

12. The method of claim 9, wherein the film comprises $SiO_2$.

13. The method of claim 9, wherein the film is formed by one of molecular vapor deposition, atomic layer deposition and chemical vapor deposition.

14. The method of claim 9, wherein the film is formed by molecular vapor deposition.

15. The method of claim 9, wherein the film is formed to a thickness of from about 2 nm to about 20 nm.

16. The method of claim 9, wherein the film is deposited at a temperature of about 260° C. or below.

17. The method of claim 9, further comprising:
forming a planar layer over the film; and
forming a plurality of micro-lenses over the planar layer.

18. The method of claim 9, further comprising forming a plurality of micro-lenses over the film using an etching process, wherein the film acts as an etch stop layer protecting the color filter array from the etching process.

19. A method of forming an imager, comprising:
forming a pixel array;
forming a light block structure over the pixel array, the light block structure having a black resist material; and
forming a film over the light block structure that holds in place particles that remain on a surface of the light block structure after its formation.

20. The method of claim 19, wherein the particles that remain on the surface of the light block structure contain pigment.

21. The method of claim 19, further comprising forming a color filter array over the pixel array, and wherein the film fastens particles containing pigment that are on a surface of the color filter array.

22. The method of claim 19, wherein the film comprises one of $SiO_2$, $TiO_2$, $Si_3N_4$, $Al_2O_3$, and $HfO_2$.

23. The method of claim 19, wherein the film comprises $SiO_2$.

24. The method of claim 19, wherein the film is formed by one of molecular vapor deposition, atomic layer deposition and chemical vapor deposition.

25. The method of claim 19, wherein the film is formed by molecular vapor deposition.

26. The method of claim 19, wherein the film is formed to a thickness of from about 2 nm to about 20 nm.

27. The method of claim 19, wherein the film is deposited at a temperature of about 260° C. or below.

28. The method of claim 19, wherein the black resist comprises one of JSR BLACK812 and FFEM black resist SK5000L.

29. A method of forming an imager, comprising:
forming a plurality of pixels;
forming a color filter array over the plurality of pixels;
forming an etch stop over the color filter array;
forming a planar layer over the etch stop; and
etching a plurality of micro-lenses within the planar layer, the etch stop protecting the color filter array from the etching, wherein the etch stop traps particles that are on a surface of the color filter array.

30. The method of claim 29, further comprising forming a light block structure before forming the etch stop, the light block structure surrounding imaging pixels of the pixel array and comprising a black resist material, and wherein the particles contain pigment and are on a surface of the light block structure.

31. The method of claim 29, wherein the etch stop comprises one of $SiO_2$, $TiO_2$, $Si_3N_4$, $Al_2O_3$, and $HfO_2$.

32. The method of claim 29, wherein the etch stop is formed by one of molecular vapor deposition, atomic layer deposition and chemical vapor deposition.

33. A method of forming an imager, comprising:
forming a plurality of pixels;
forming a color filter array over the plurality of pixels;
forming an etch stop over the color filter array;
forming a planar layer over the etch stop; and
etching a plurality of micro-lenses within the planar layer, the etch stop protecting the color filter array from the etching, wherein the etch stop is formed to a thickness of from about 2 nm to about 20 nm.

* * * * *